United States Patent [19]

Norris et al.

[11] 4,360,791
[45] Nov. 23, 1982

[54] FREQUENCY CONVERTING FILTER

[75] Inventors: Jerry L. Norris, Dallas; Clinton S. Hartman, Richardson, both of Tex.

[73] Assignee: Texas Instruments Incorporated, Dallas, Tex.

[21] Appl. No.: 758,366

[22] Filed: Jan. 10, 1977

[51] Int. Cl.³ ............... H03H 15/02; H03H 17/02; G11C 19/28

[52] U.S. Cl. ............... 333/165; 307/221 D; 333/166

[58] Field of Search .......... 333/70 R, 70 T, 165–166, 333/173; 307/221 R, 221 C, 221 D

[56] References Cited

U.S. PATENT DOCUMENTS

| | | | |
|---|---|---|---|
| 3,402,355 | 9/1968 | Hannan et al. | 328/151 |
| 3,997,973 | 12/1976 | Buss | 333/70 T |
| 3,999,152 | 12/1976 | Sato et al. | 333/70 T |
| 4,093,872 | 6/1978 | Hartman et al. | 357/24 X |

OTHER PUBLICATIONS

Puckette et al.–"Bucket-Brigade Transversal Filters'-–IEEE Trans. on Circuits and Systems, vol. CAS–21, No. 4, Jul. 1974; pp. 502–510.

Buss et al.–"Transversal Filtering Using Charge Transfer Devices"–IEEE Journal of Solid-State Circuits, vol. SC–8, No. 2, Apr. 1973; pp. 138–146.

*Primary Examiner*—Marvin L. Nussbaum
*Attorney, Agent, or Firm*—William E. Hiller; Melvin Sharp; James T. Comfort

[57] ABSTRACT

Disclosed is a frequency converting filter comprised of a charge transfer device transversal filter and a non-sampling filter. The transversal filter has an output lead coupled to an input of the non-sampling filter, and has frequency passbands of width $\Delta f$ centered at the fixed frequencies $nf_s \pm f_o$. The non-sampling filter has a single passband. The single passband has a width of less than $f_s - f_o - \Delta f/2$ and it is centered to include only a selected one of the passbands of the transversal filter.

1 Claim, 35 Drawing Figures

FREQUENCY CONVERTING FILTER

BACKGROUND OF THE INVENTION

This invention relates to analog signal processing devices, and more particularly to electronic filtering and mixing devices. Filtering devices receive electronic input signals containing a plurality of frequencies, including a desired "channel" or "frequency spectrum" $\Delta f$, and pass only signals in the $\Delta f$ frequency spectrum. Mixing devices receive a frequency spectrum $\Delta f$, and generate output signals having frequency spectrums proportional to the frequency spectrum $\Delta f$ and centered about new frequencies.

The invention herein described is called a frequency converting filter and it performs both the filtering and the mixing operation. That is, it receives input signals containing a plurality of frequencies including a desired frequency spectrum $\Delta f$. The output of the frequency converting filter is an electronic signal having a frequency spectrum proportional to the $\Delta f$ frequency spectrum and centered about a new frequency. The field of use for the frequency converting filter is very board. Typical uses include the processing of signals in radio receivers, television receivers, and CB transceivers.

In the past, filtering and mixing operations were performed by electronic circuits having several undesirable aspects. In part, this is due to the narrow spacing between adjacent channels in the frequency spectrum. This spacing requires the filter to have an abrupt transition from its passband to its stop band. The width of this transition is generally referred to as the skirt response of the filter. In order to achieve a narrow skirt response, either multi pole mechanical filters, lumped inductor-capacitor elements, or multi pole crystal filters were required. These are both expensive and too large to integrate on a semiconductor chip.

In comparison, the present invention utilizes a charge transfer device to achieve the sharp skirt responses. The manner in which this is achieved is described in the detailed description. The charge transfer device may be a charge coupled device (CCD) or a bucket brigade device (BBD) as an example. The charge transfer device is both inexpensive and capable of being integrated on a single semiconductor chip.

Also, in the past, the mixing operation or frequency converting operation was performed by an oscillator circuit and a mixer circuit which were separate from the filter circuit. In comparison, the present invention performs frequency conversion by a sampling circuit that is an integral part of the transversal filter circuit. By taking periodic samples of the input signals, the present invention creates new signals having frequency spectrums proportional to the input signals but being spaced about multiples of the sampling frequency. These new signals are then passed through both the transversal filter and continuous filter. The former passes the desired channel at multiples of the sampling frequency, and the latter passes only a selected one of these channels.

Another important aspect of this invention is that the skirt response of this continuous filter need not be abrupt. This is because the sampling frequency is high, and thus the spacing between multiples of the sampling frequency is large. Therefore, the continuous filter doesn't require multi pole mechanical elements or crystals, and it is capable of being integrated on a semiconductor chip along with the charge transfer device filter. In addition, a separate oscillator circuit and mixing circuit are not needed. Thus, the invention is less expensive and requires less physical space than the past structures which were used to perform filtering and mixing.

Accordingly, it is one object of the invention to provide an improved device for filtering and mixing electronic signals.

It is another object of the invention to provide a frequency converting filter having an abrupt transition from stop band to pass band.

Another object of the invention is to provide a frequency converting filter requiring no oscillator circuit and no mixing circuit.

Still another object of the invention is to provide a frequency converting filter that is capable of being integrated on a single semiconductor chip.

SUMMARY OF THE INVENTION

These and other objectives are accomplished in accordance with the invention by a charge transfer device and non-sampling filter. The charge transfer device is configured as a transversal filter. It has frequency passbands of $\Delta f$ centered at the frequencies in $nxf_s \pm f_o$. The output of the charge transfer device couples to the input of the non-sampling filter. The non-sampling filter has a single passband. The single passband has a width of less than $f_s - f_o - \Delta f/2$. This single passband is centered to include only a selected one of the multiple passbands of the charge transfer device transversal filter.

BRIEF DESCRIPTION OF THE DRAWINGS

The essential features believed to be characteristic of the invention are set forth in the appended claims; the invention itself, however, as well as other features and advantages thereof, may be best understood by referring to the following detailed description of the preferred embodiments when read in reference to the accompanying drawings, wherein:

FIGS. 8b–8d are surface potential diagrams taken at various instances in time for the charge injection sampling device of FIG. 8a.

DETAILED DESCRIPTION

Figure 1:
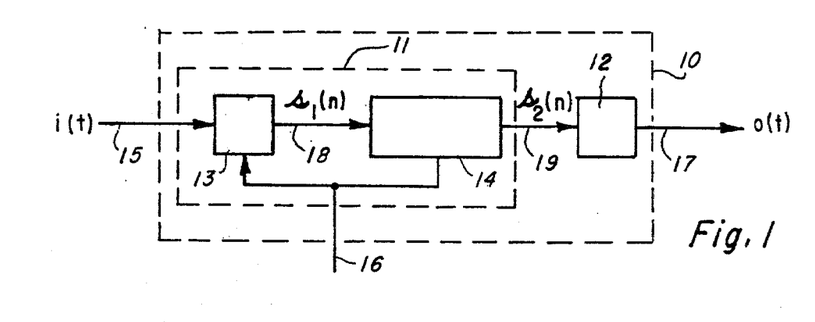
FIG. 1 is a block diagram of the frequency converting filter.

Referring to FIG. 1 a block diagram of a frequency converting filter 10 is illustrated. Filter 10 has input leads 15 for receiving input signals i(t) and output leads 17 on which are generated output signals o(t). Signal i(t) contains several frequency bands. Filter 10 passes only a selected one of these bands, and in addition, it converts the selected band to a different frequency band.

Frequency converting filter 10 is comprised of two major components, a charge transfer device transversal filter 11 and a continuous (or non-sampling) filter 12. Transversal filter 11 is further subdivided into two other components. These include a charge injection sampling device 13 and a sampled data transfer function generator 14. Input leads 15 are coupled to the input of charge injection sampling device 13. The output of sampling device 13 couples via leads 18 to the input of transfer function generator 14. The output of transfer function generator 14 couples via leads 19 to the input of the non-sampling filter 12. Output leads 17 couple to the output of filter 12. In addition, transversal filter 11 has clocking leads 16, and clock signals of a frequency $f_s$ are applied thereto. In response to these clock signals, sampling device 13 samples the input signals i(t) at the frequency $f_s$, and transfer function generator 14 generates output signals at the same frequency.

Figure 2A:
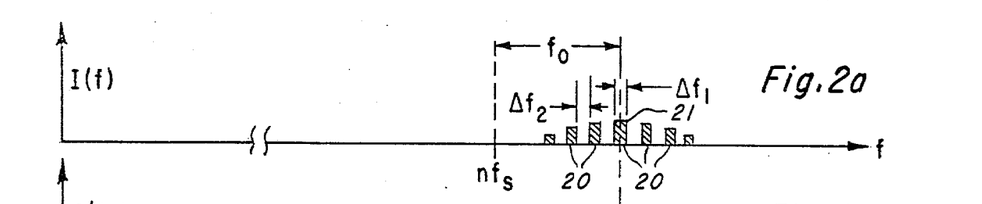
FIGS. 2a–2g are frequency spectrums of signals appearing at selected points within the frequency converting filter of FIG. 1.

The functional operation of frequency converting filter 10 is best understood when described in conjunction with FIGS. 2a through 2g. Referring now to FIG. 2a the frequency spectrum I(f) of signal i(t) is illustrated. Signal I(f) contains several frequency bands 20. Each of these bands has a width of $\Delta f_1$, and the spacing between adjacent bands is $\Delta f_2$. The center frequency of a selected one of these bands 21 occurs at a frequency $(nxf_s \pm f_o)$.

Figure 2B:
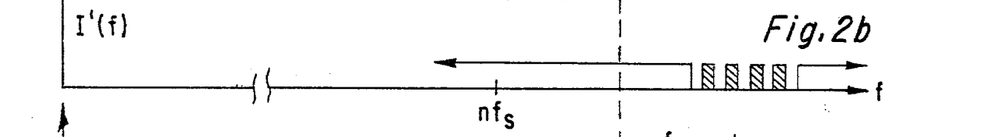
Figure 2C:
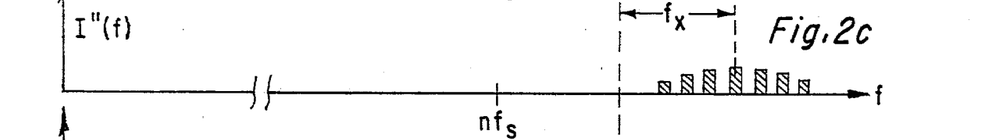

FIGS. 2b and 2c illustrate how signal I(f) may be generated in a radio receiver, as an example. The input signal to a radio receiver I'(f) is comprised of a plurality of frequency bands. Only one of these bands is desired to be received at a particular time. Thus signal I'(f) is as illustrated in FIG. 2b. Signal I'(f) is then passed through a broadband filter and amplified to produce a signal I''(f) illustrated in FIG. 2c. Signal I''(f) is then mixed with a frequency $f_X$ thereby producing sum and difference frequency bands. The frequency $f_X$ is chosen such that the desired frequency band 21 has a center frequency of $nxf_s \pm f_o$ as previously described.

Signal I(f) is received by charge injection sampling device 13 on leads 15. Sampling device 13 samples signal I(f) at a frequency $f_s$. The sampled signals $s_1(n)$ appears on lead 18. It has a frequency spectrum $S_1(f)$ illustrated in FIG. 2d. Due to the sampling action of device 13, the frequency spectrum $S_1(f)$ consists of a plurality of spectrums, each proportional to I(f) and centered about the frequencies $Nxf_s$.

Figures 2D, 2E:
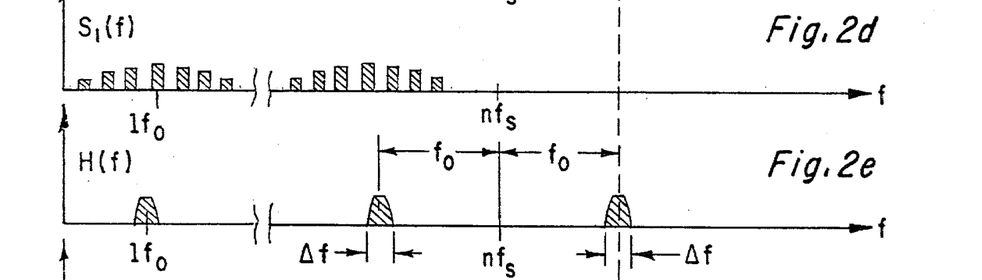

The sampled signal $s_1(n)$ is then received by transfer function generator 14. Transfer function generator 14 has a frequency response H(f) consisting of passbands of width $\Delta f$ which are centered at frequencies $nxf_s \pm f_o$. These passbands are illustrated in FIG. 2e. The width $\Delta f$ of each passband is greater than $\Delta f_1$ but less than $\Delta f_1 + \Delta f_2$. That is, each pass band of transfer function generator 14 is wider than the selected frequency band 21 but narrower than it plus the spacing between bands.

Figure 2F:
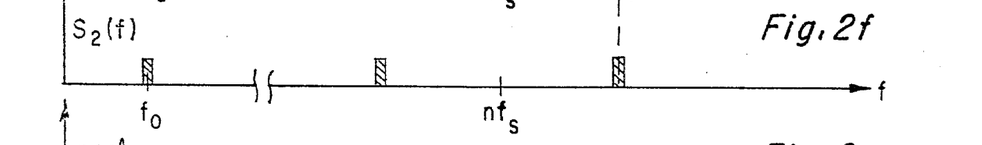

FIG. 2f illustrates the frequency spectrum $S_2(f)$ of the output signal $s_2(n)$ of transfer function generator 14. Signal $s_2(n)$ appears on lead 19.

Figure 2G:
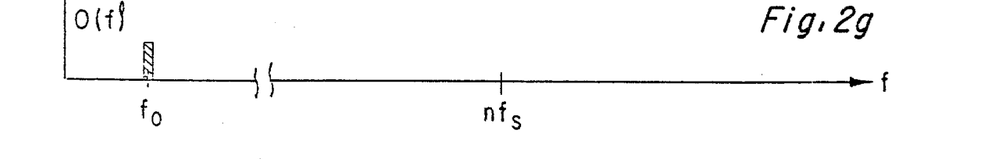

The signal on lead 19 is received by non-sampling filter 12. Filter 12 has a single passband. This single passband has a width of less than $f_s - f_o - (\Delta f/2)$, and it is centered to include only a selected one of the passbands of the transversal filter 11. For example, filter 12 may be a low pass filter, in which case the frequency spectrum O(f) of the signal appearing on output leads 17 is centered at $f_o$. This is illustrated in FIG. 2g.

Up to this point, the description has focused on the functional operation of frequency converting filter 10. What remains to be explained is how to physically construct a charge transfer device transversal filter having frequency passbands as illustrated in FIG. 2e, and how to physically construct a non-sampling filter 12 having a single frequency passband which includes only a selected one of the multiple passbands of transversal filter 11.

Figure 3:
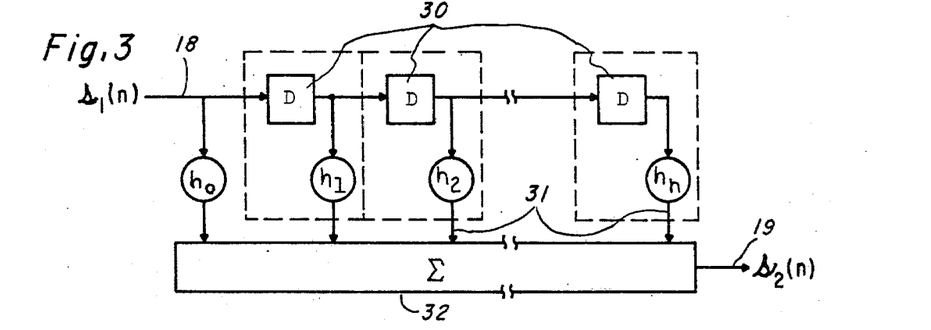
FIG. 3 is a block diagram of a charge transfer device arranged as a transversal filter.

Referring to FIG. 3, a schematic diagram of transfer function generator 14 is illustrated. Transfer function generator 14 is comprised basically, of a serial array of several analog voltage delay stages 30. The first stage receives signal $s_1(n)$ on lead 18. Each stage feeds the next stage in series, and each stage also has a weighted output lead 31. The weights are serially designated $h_0$, $h_1$, $h_2$,—. Leads 31 connect to a summer 32. The output of summer 32 is signal $s_2(n)$ on lead 19.

The impulse response h(n) of transfer function generator 14 is easily derived by applying an impulse to lead 18, and by calculating the resulting signal on lead 19. If $s_1(o)=1$ and $s_1(n)=0$ for $n \neq 0$ then it is apparent that h(n) equals $h_1$, $h_1$, $h_2$,—for n=0, 1, 2−N−1.

By appropriately choosing the values $h_0$, $h_1$, $h_2$,—, the previously desired frequency transfer function H(f) is obtained. Before describing the specific values of $h_0$, $h_1$, $h_2$,—which yield H(f), further discussion of how to construct the analog delay stages 30, and how to construct the weighted output leads 31 is in order.

Figures 4A, 4B:
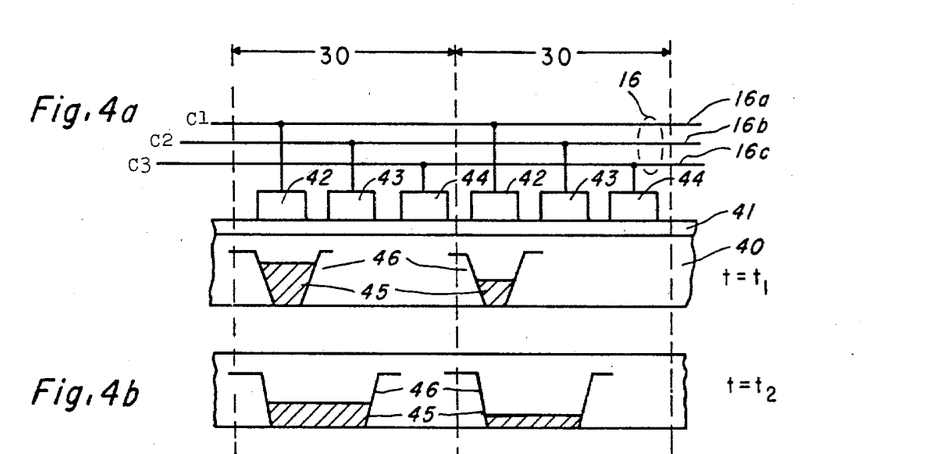
FIGS. 4a–4d are greatly enlarged cross sectional views of two adjacent stages within the transversal filter of FIG. 3.

To this end, FIGS. 4a−4d illustrate cross-sectional views of one type of charge transfer device known as a 3-phase n-channel charge coupled device. In particular, FIG. 4a illustrates a cross-sectional view of two adjacent analog delay stages within this CCD. Basically, the stages 30 share a common semiconductor substrate 40 having a common insulating layer 41. Each stage has a set of three electrodes 42, 43, 44 disposed on layer 41. Three common clock leads 16a, 16b, 16c interconnect the three electrodes of each stage.

A signal within each stage is carried by packets of minority charge carriers 45 within substrate 40. These packets 45 are trapped by potential wells 46 within each stage. The potential wells 46 are selectively formed under electrodes 42, 43, or 44 by applying a voltage of proper polarity to leads 16a, 16b, 16c respectively. The proper polarity is one which will repel the majority charge carriers in substrate 40. For example, if substrate 40 is p-type silicon, the majority charge carriers are holes, and thus a potential well is formed by applying a positive voltage to leads 16a, 16b, and 16c.

Figure 4C:
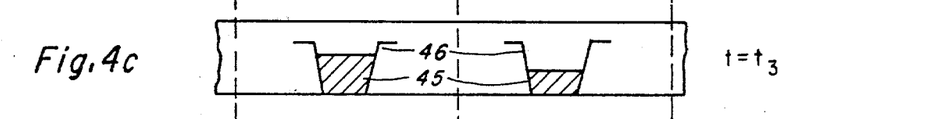
Figure 4D:
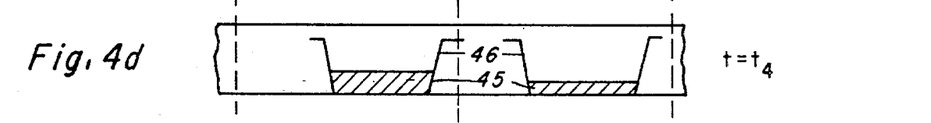
Figure 4E:
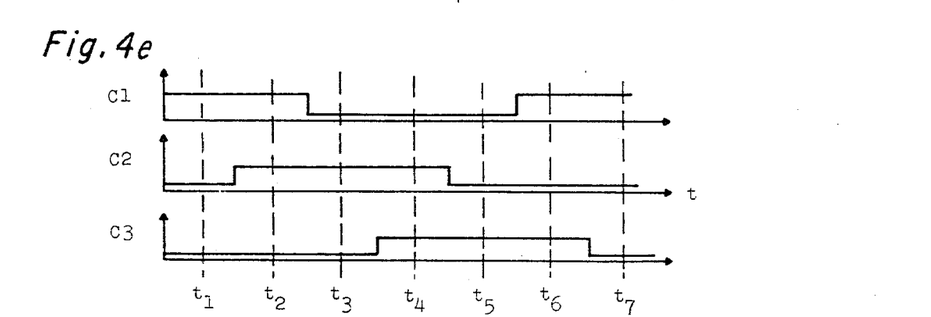
FIG. 4e is a timing diagram illustrating a clock sequence for moving charge within the transversal filter of FIG. 3.

The charge packets 45 are moved from stage to stage by properly sequencing the voltage on leads 16a, 16b, 16c. FIG. 4e illustrates one acceptable clock sequence. At a time $t_1$, clock C1 on lead 16a is at a high voltage while clock C2 on lead 16b and clock C3 on lead 16c are near ground. Thus, a potential well is formed only under electrodes 42 of each stage as illustrated in FIG.

4a. At a time $t_2$, clocks C1 and C2 both are at a high voltage while clock C3 remains at ground. Thus a potential well is formed under electrodes 42 and 42. The charge packets 45 are then distributed under these electrodes, as illustrated in FIG. 4b. At a time $t_3$, clock C2 has a high voltage while clocks C1 and C3 are at ground. Thus a potential well is formed only under electrodes 43; and charge packets 45 exist only under electrode 43, as illustrated in FIG. 4c. The clocks can continue to sequence as indicated at time instants $t_1$-$t_7$. This sequence will move the charge packet under electrode 42 of one stage to a potential well 46 under electrode 42 of the adjacent stage. $T_s$ is the time interval in which $t_1$-$t_7$ occurs; and $T_d$ is total delay of all the stages—which equals $NT_s$.

Figure 5:
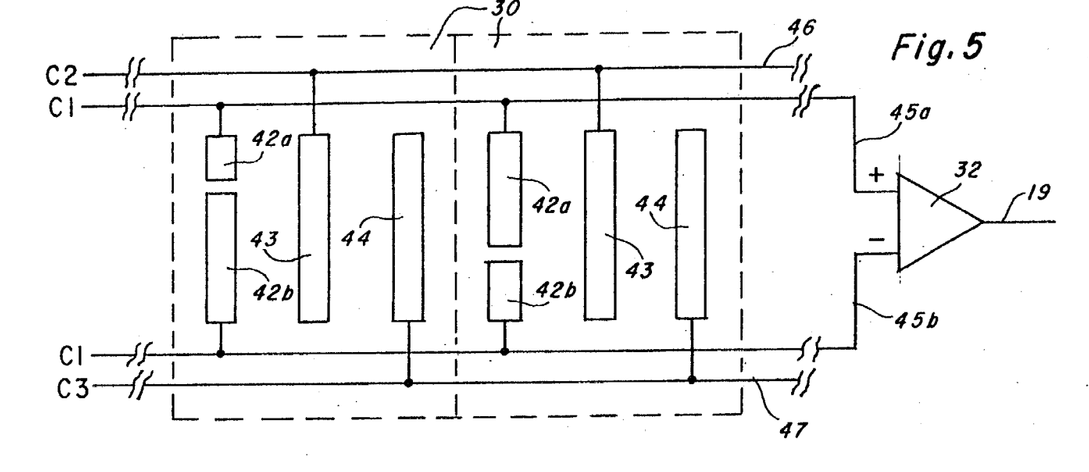
FIG. 5 is a schematic diagram of two adjacent stages of a split electrode charge transfer device.

Referring to FIG. 5, one implementation of weighted output leads 31 and summer 32 is illustrated. This implementation is called a split electrode CCD. In the split electrode CCD, one electrode of each stage 30 is split into two partial electrodes. FIG. 5 illustrates a schematic top view of a CCD in which each of the electrodes 42 is split into partial electrodes 42a and 42b.

The principle of operation of the split electrode CCD is that as charge packet 45 transfer within substrate 40 under an electrode, a proportional but opposite charge must flow into the electrode from the clock line. Since the charge packets 45 are nearly evenly distributed under electrodes 42, the amount of charge which flows into each partial electrode 42a and 42b is proportional to its area.

Positive and negative weights are obtained by letting the charge in partial electrode 42a represent a positive value, by letting the charge in partial electrode 42b represent a negative value, and by adding the two values by summer 32. For example, to obtain a weighted output $h_m$ on the $m^{th}$ stage having a value of $h_m + 1$, the split in the $m^{th}$ stage should occur so all the charge flows into partial electrode 42a. To obtain a value of $h_m = -1$, the split in the $m^{th}$ stage should occur so all the charge flows into partial electrode 42b. And to obtain a value of $h_m = 0$, the split in the $m^{th}$ stage should occur so an equal amount of charge flows into partial electrodes 42a and 42b. Values of $h_m$ between $+1$ and $-1$ are limited only by the accuracy of placement of the split.

Figure 6A:
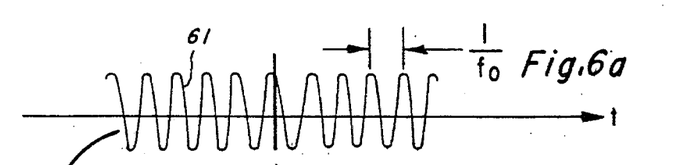
FIGS. 6a–6g are timing diagrams of impulse responses which are combined to define the position of the slits of the split electrodes illustrated in FIG. 5.
Figure 6B:
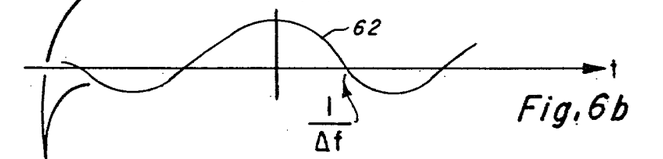
Figure 7A:
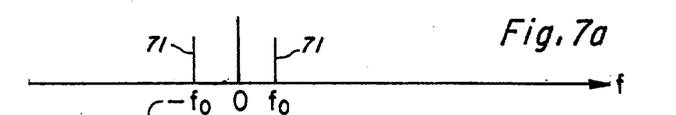
FIGS. 7a–7g are frequency spectrums of the impulse responses illustrated in FIGS. 6a–6g.
Figure 7B:
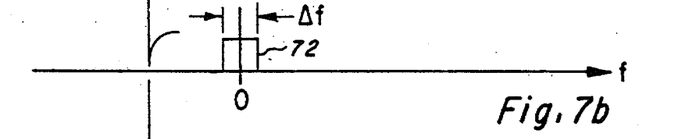

Referring now to FIGS. 6a through 6g and FIGS. 7a through 7g, the specific values of $h_0$, $h_1$, $h_2$–which yield the desired transfer function H(f) will be described. To begin, it should be recalled that the frequency response of a device equals the Fourier Transform of the impulse response of the device. Therefore, a device having an impulse response 61 of COS $(2\pi f_o t)$ as illustrated in FIG. 6a, has a frequency response 71 of $+f_o$ and $-f_o$ as illustrated in FIG. 7a. Similarly, a device having an impulse response 62 of the form (Sin X)/X, as illustrated in FIG. 6b, has a frequency response 72 of an ideal low pass filter as illustrated in FIG. 7b. That is, frequency response 72 has the shape of a single pulse of width $\Delta f$ centered about the zero frequency. The term $1/\Delta f$ is the time at which the first zero crossing of the (sin X)/X impulse response occurs.

Figure 6C:
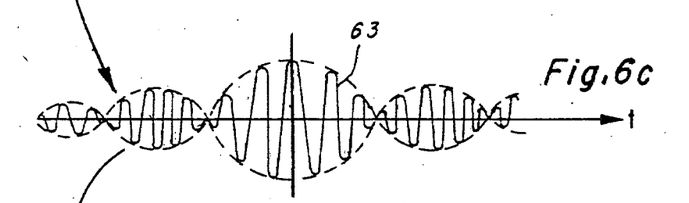
Figure 7C:
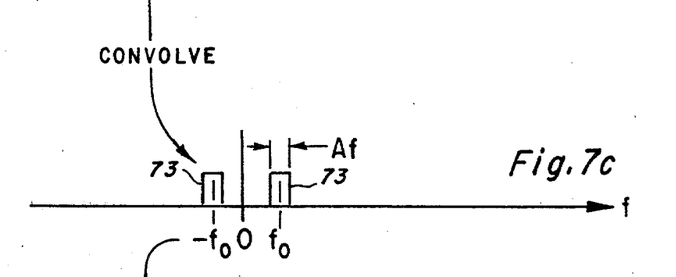
Figure 7D:
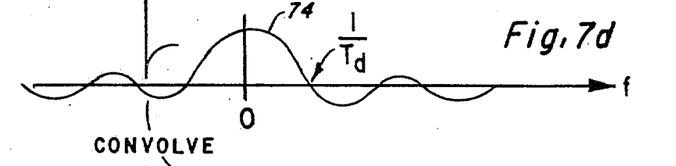

The second principle that needs to be recalled is that multiplication in the time domain is equivalent to convolution in the frequency domain. FIG. 6c illustrates an impulse response 63 which equals the product of the impulse responses 61 and 62. Therefore, the frequency response of the device having impulse response 63 is obtained by convolving frequency response 71 with frequency response 72. The result of this convolution step yields a frequency response 73, as is illustrated in FIG. 7c. As therein illustrated, frequency response 73 of two passbands, and of width $\Delta f$, is centered about the frequencies $\pm f_o$.

Figure 6D:
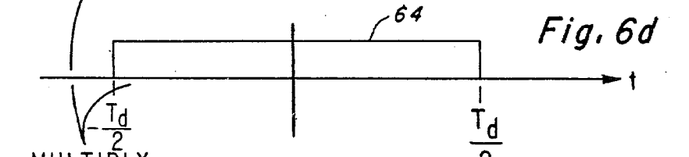
Figures 6E, 6F:
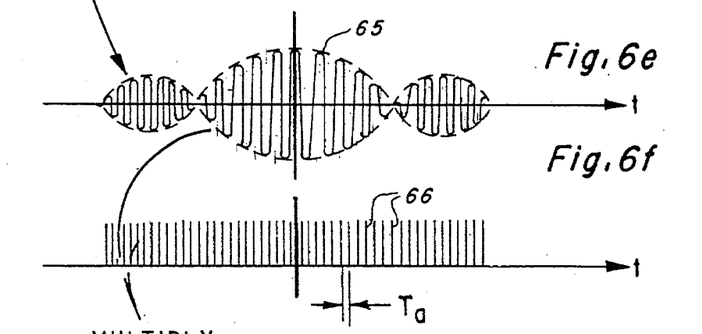

Next, impulse response 63 is multiplied by another impulse response 64. FIG. 6d illustrates impulse response 64 and, as therein illustrated, it consists of a single pulse which lasts from minus $T_d/2$ to plus $T_d/2$. The multiplication of impulse response 63 with impulse response 64 yields a new impulse response 65, which is illustrated in FIG. 6e. As therein illustrated, response 65 is a truncated version of response 63.

Figure 7E:
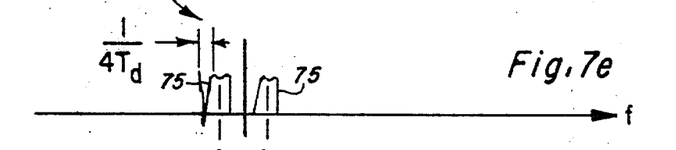

The frequency response of a device having the truncated impulse response 65 is obtained by convolving frequency response 73 with frequency response 74—which is the Fourier transform of impulse response 64. The result of this convolution step yields a frequency response 75 as illustrated in FIG. 7e. Frequency response 75 has two passbands of width $\Delta f$ centered about frequencies $\pm f_o$. In addition, the transition from the passband to the stop band frequency is not instantaneous, but has a width. The width of this transition is generally referred to as skirt response, and it is approximately equal to one over four times $T_d$. Thus, the width of the skirt response decreases as the width of impulse response 64 increases.

Figure 7F:
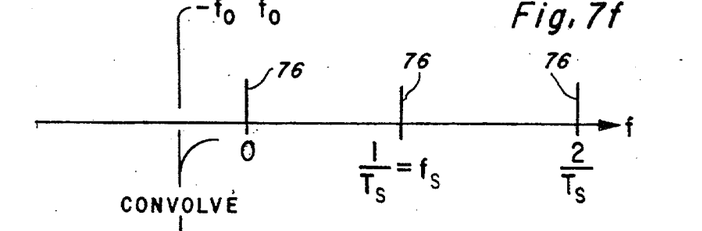
Figure 7G:
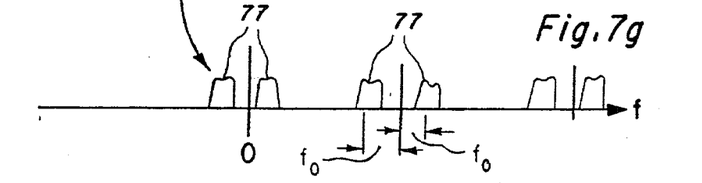

Impulse response 65 is then multiplied by still another impulse response 66. FIG. 6f illustrates impulse response 66 which is that of an ideal sampler. That is, it consists of a series of unit impulses which are spaced apart from each other by a time delay of $T_s$. A frequency response 76, corresponding to impulse response 66, is illustrated in FIG. 7f. It consists of the set of frequencies o, $\pm(1/T_s)$, $\pm(2/T_s)$–. In this case, $(1/T_s)$ equals the sampling frequency $f_s$. Convolving frequency response 76 with frequency response 75 yields frequency response 77, as illustrated in FIG. 7g. Response 77 consists of a series of passbands, each of width $\Delta f$. These passbands are centered about frequencies $nf_s \pm f_o$. Each passband also has a skirt response of approximately $1/4T_d$. Thus, this frequency response approximates the desired frequency response H(f) which was previously described in conjunction with the FIG. 2e.

Figure 6G:
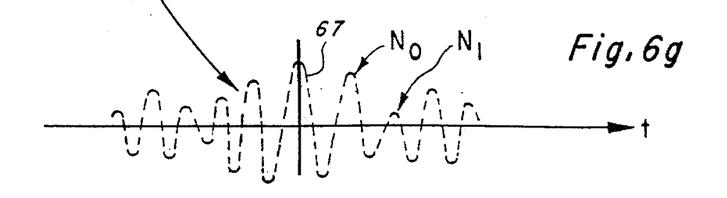

An impulse response which yields frequency response 77 is obtained by multiplying impulse response 65 with impulse response 66. This yields an impulse response 67 as illustrated in FIG. 6g. Response 67 has the general form of [sin x/x][cos $2\pi f_o t$] times a truncating function and times a sampling function. This impulse response is implemented by transfer function generator 14 to yield the desired frequency response H(f).

This analysis therefore describes how the splits in electrodes 42a and 42b should be arranged. To summarize these splits will have the profile of (sin x/x) times cos $(2\pi f_o t)$. The frequency $f_o$ equals $1/(T_s N_o)$ where $1/T_s$ is the fixed sampling rate and $N_o$ is the number of stages 30 over which the term cos $(2\pi f_o t)$ completes one cycle. Similarly, the bandwidth $\Delta f$ of each passband equals $1/(T_s N_1)$ where $1/T_s$ equals the fixed sampling rate, and $N_1$ equals the number of stages in which the (sin x)/x function passes before reaching its first zero crossing. The terms $N_o$ and $N_1$ are illustrated in FIG. 6g. The skirt response equals approximately $1/(4T_d)$, where $T_d$ equals the total number of stages in the transversal filter times the sampling interval $T_s$.

Figure 8A:
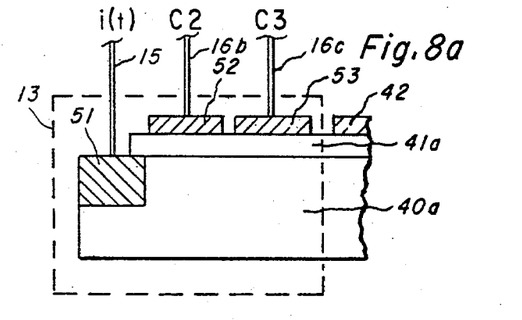
FIG. 8a illustrates a greatly enlarged cross sectional view of a charge injection sampling device which comprises a portion of the transversal filter of FIG. 1.

Referring now to FIGS. 8a-8d, the structure and operation of charge injection sampling device 13 will be described. FIG. 8a illustrates a greatly enlarged cross sectional view of one embodiment of the sampling device. This embodiment is formed in a portion 40a of substrate 40 which lies adjacent to the first stage of transfer function generator 14. A charge source 51 lies within this portion of the substrate. Charge source 51 consists of an ion diffusion or ion implant region. The ions comprising charge source 51 have majority charge carriers of a type opposite to those in substrate 40. Input lead 15 couples to charge source 51. A portion 41a of insulating layer 41 lies on the surface of substrate 40 above the region occupied by the charge injection sampling device 13. An electrode 53 lies on insulating layer 41a. Electrode 53 lies next to electrode 42 of the first stage 30 of transfer function generator 14, and is spaced apart from charge source 51. Lead 16c, carrying clock signal C3, couples to electrode 53. In addition, an electrode 52 lies on the surface of the insulating layer portion 41a in the space lying between electrode 53 and charge source 51. Lead 16b, carrying clock signal C2, couples to electrode 52.

Figure 8B:
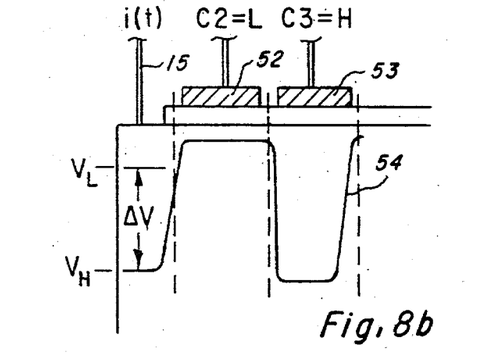
Figure 8C:
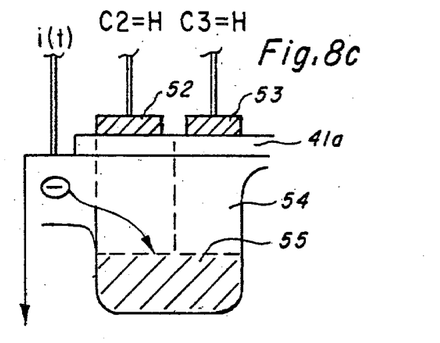
Figure 8D:
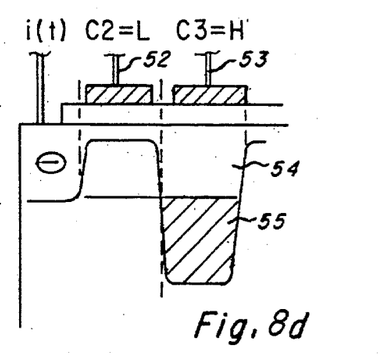

FIGS. 8b–8d illustrate the sampling action of device 13 for the case where substrate 40 is P-type, as an example. When the clock signal C2 is low and clock signal C3 is high, a potential barrier exists on the surface area of substrate 40 lying between charge source 51 and electrode 53. Thus, the input signal i(t) on lead 15 can vary between values $V_L$ and $V_H$ without injecting minority charge carriers into the potential well 54 lying under electrode 53. This is illustrated in FIG. 8b. Conversely when clocks C2 and C3 are both at a high voltage level, minority charge carriers are injected from charge source 51 into the potential well 54 lying under electrode 53. This forms a charge packet 55 under electrodes 52 and 53. This charge injection operation is illustrated in FIG. 8c. Subsequently, clock C2 goes to a low voltage level while clock C3 remains at a high voltage level. Thus, a potential barrier is again formed between charge source 51 and the surface area under electrode 53. This potential barrier traps charge packet 55 under electrode 53. The amount of charge in charge packet 55 is proportional to the magnitude of the input signal i(t) on lead 15 at the instant clock C2 makes the high voltage to low voltage transition. In other words, input signal i(t) is sampled on a clock edge. Thus, the sampling action of device 13 approximates that of an ideal sampler; and the charge packets 55 that are generated by this sampling action represents the signal $s_1(n)$ whose frequency spectrum was previously described in conjunction with FIG. 2d as $S_1(f)$.

Figure 9:
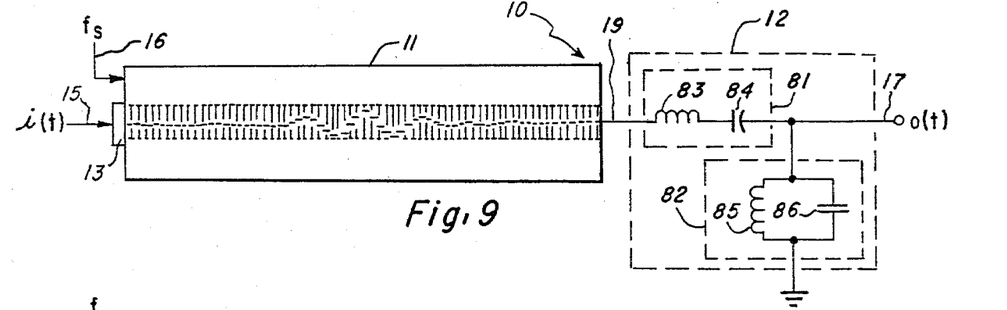
FIG. 9 is a detailed circuit diagram of one particular embodiment of the frequency converting filter of FIG. 1.

Referring now to FIG. 9, a detailed circuit diagram of one particular embodiment of the entire frequency converting filter 10 is illustrated. Frequency converting filter 10 consists of a charge transfer device transversal filter 11 having an output lead 19 coupled to the input of a non-sampling bandpass filter 12. The charge device transversal filter 11 is of the split electrode type and, as FIG. 9 illustrates, the profile of these splits are of the form as previously described. Bandpass filter 12 consists of a series resonant circuit 81 having an input coupled to lead 19, and a parallel resonant circuit 82 having an input coupled to the output of series resonant circuit 81. Series resonant circuit 81 consists of an inductor 83 in series with a capacitor 84. Parallel resonant circuit 82 consists of an inductor 85 in parallel with a capacitor 86. The values of inductors 83 and 85 and capacitors 84 and 86 are chosen so as to produce a single passband which coincides with one of the multiple passbands of the transversal filter 11. The method for picking specific values for circuit elements 83–86 is conventional in the art. For example, a textbook, Linear Network Design and Synthesis by W. H. Chinn, 1964 illustrates one method of snythesizing such a filter on page 330. The actual values chosen for circuit elements 83–86 will vary depending upon the width and spacing of the multiple passbands of filter 11—one of which is to be passed by filter 12.

The non-sampling filter 12 may also take on additional forms which are modifications of that illustrated in FIG. 9. For example, depending on the width of the passband required, either series resonant circuit 81 or parallel resonant circuit 82 may be eliminated. Conversely, additional resonant circuits 81 and 82 may be added to form multiple "T" or "π" circuits. The design of these "T" and "π" type networks are also described in the above referenced W. H. Chinn text.

Figure 10:
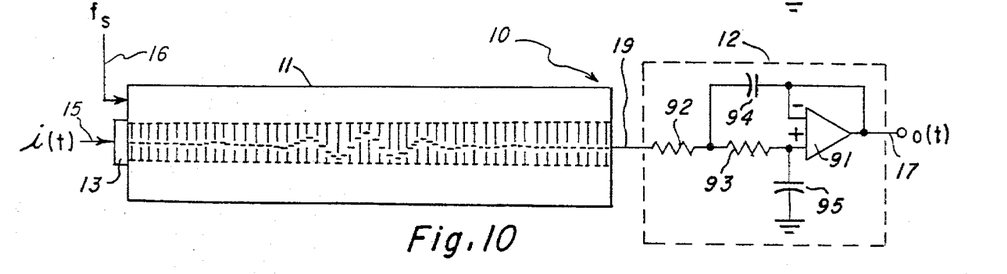
FIG. 10 is a detailed circuit diagram of another particular embodiment of the frequency converting filter of FIG. 1.

Referring now to FIG. 10, a detailed circuit diagram of a second embodiment of the frequency converting filter is illustrated. In this embodiment the non-sampling filter 12 is an active filter. More specifically it includes a high gain DC operational amplifier 91. Signal $s_2(n)$ on lead 19 couples to the input of the operational amplifier 91 through two serially connected resistors 92 and 93. The output of operational amplifier 91 is coupled to output lead 17, and is fed back through a capacitor 94 to a node lying between resistors 92 and 93.

A second capacitor 95 couples the input of operational amplifier 91 to ground. This configuration of operational amplifier 91 in conjunction with elements 92 through 95 forms a low pass active filter. The actual values of circuit elements 92–95 may vary, and are chosen by a practice that is conventional in the art. One practice is illustrated for example in the 1976 Signetics Integrated Circuits Catalog on page 2–93.

Operational amplifiers 91 may also be used in the non-sampling filter 12 to obtain a bandpass characteristic. In this configuration two operational amplifiers are used. One of the operational amplifiers is interconnected with resistors and capacitors as illustrated in FIG. 10 to form a low pass filter. The other operational amplifier is interconnected with resistors and capacitors to form a high pass active filter. The input of the highpass active filter couples to the output of the low pass active filter thereby producing a bandpass active filter. The high pass active filter is designed by replacing resistors 92 and 93 with capacitors, and by replacing capacitors 94 and 95 with resistors. This structure is also described in the previously referenced Signetics handbook on page 2–93.

Various specific embodiments of the frequency converting filter have now been described in detail. From this description, it will be apparent that various changes and modifications may be made without departing from the nature and spirit of the invention. For example, the charge transfer device transversal filter may be constructed on a P-type or an N-type substrate. In addition, transversal filters having any number of clocking phases per stage are acceptable. Further, other type charge injection sampling devices may be used. Also, the non-sampling filter and the transversal filter may be integrated on the same or different semiconductor chips. Therefore, since it is apparent that many changes and modifications can be made in the above details without departing from the nature and spirit of the invention, it is understood that the invention is not to be limited to the described details except as set forth in the appended claims.

What is claimed is:

1. A frequency converting filter comprising:
a split electrode charge coupled device transversal filter for receiving an input signal and having a plurality of serially connected split electrode stages which form an impulse response, said transversal filter including signal sampling means for providing samples of the input signal at a predetermined sampling frequency; and
a non-sampling filter for providing the resultant output;
said transversal filter having an output lead coupled to an input of said non-sampling filter, and having frequency passbands of width $\Delta f$ centered at fixed frequencies $nf_s \pm f_o$, where
$n$ = an integer multiple of the sampling frequency,
$f_s$ = the sampling frequency, and
$f_o$ = the center frequency, removed from the sampling frequency, of the desired frequency passband;
the splits in said split electrode stages of said transversal filter having a profile proportional to $(\sin/n)(\cos 2\pi f_o n)$; and
said non-sampling filter having a single passband, said single passband having a width of less than $f_s - f_o - \Delta f/2$ and being centered to provide only a selected one of said passbands of said transversal filter as the resultant output.

* * * * *